(12) United States Patent
Yoshizawa

(10) Patent No.: US 7,361,219 B2
(45) Date of Patent: Apr. 22, 2008

(54) METHOD FOR PRODUCING SILICON WAFER AND SILICON WAFER

(75) Inventor: Ken Yoshizawa, Niigata (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 108 days.

(21) Appl. No.: 10/565,108

(22) PCT Filed: Jul. 12, 2004

(86) PCT No.: PCT/JP2004/009921

§ 371 (c)(1),
(2), (4) Date: Jan. 19, 2006

(87) PCT Pub. No.: WO2005/007940

PCT Pub. Date: Jan. 27, 2005

(65) Prior Publication Data

US 2006/0174820 A1    Aug. 10, 2006

(30) Foreign Application Priority Data

Jul. 23, 2003  (JP)  ............... 2003-278483

(51) Int. Cl.
*C30B 21/04* (2006.01)
*C30B 13/34* (2006.01)
(52) U.S. Cl. .................. 117/49; 117/14; 117/15; 117/42
(58) Field of Classification Search .......... 117/14, 117/15, 42, 49; 423/328.2; 428/141, 693
See application file for complete search history.

(56) References Cited

U.S. PATENT DOCUMENTS 6,086,670 A * 7/2000 Ito ........................ 117/13

6,840,998 B2 * 1/2005 Altmannshofer et al. ..... 117/33
2004/0072437 A1 * 4/2004 Iizuka et al. ................. 438/693

FOREIGN PATENT DOCUMENTS

| JP | A 04-002683 | 1/1992 |
| JP | A 09-165298 | 6/1997 |
| JP | A 2002-025874 | 1/2002 |

OTHER PUBLICATIONS

Dyer, "Dislocation-Free Czochralski Growth of <110> Silicon Crystals," Journal of Crystal Growth, vol. 47, pp. 533-540 {1979}.
Murthy, "Growth of Dislocation-Free Silicon Crystals in the <110> Direction for Use as Neutron Monochromators," Journal of Crystal Growth, vol. 52, pp. 391-395 {1981}.

* cited by examiner

*Primary Examiner*—Felisa Hiteshew
(74) *Attorney, Agent, or Firm*—Oliff & Berridge, PLC

(57) ABSTRACT

The present invention are a method for producing a silicon wafer having a crystal orientation <110> from a silicon single crystal ingot grown by a Floating Zone method (FZ method), wherein, at least, an FZ silicon single crystal ingot is grown by being made to be dislocation-free by Dash Necking method using a seed crystal having its crystal axis inclined at a specified angle from a crystal orientation <110>, and the grown FZ silicon single crystal ingot is sliced at the just angle of a crystal orientation <110> to produce a silicon wafer having a crystal orientation <110>, and a silicon wafer produced by the method. Thereby, there are provided a method for producing a silicon wafer having a crystal orientation <110> from a silicon single crystal ingot made to be dislocation-free at a high success rate by using Dash Necking method by FZ method, and a silicon wafer having an crystal orientation <110>.

2 Claims, 3 Drawing Sheets

METHOD FOR PRODUCING SILICON WAFER AND SILICON WAFER

This application is a national stage application of International Application No. PCT/JP2004/09921 filed Jul. 12, 2004.

TECHNICAL FIELD

The present invention relates to a method for producing a silicon wafer having a crystal orientation <110> and a silicon wafer having a crystal orientation <110>.

BACKGROUND ART

Conventionally, a silicon wafer is produced by slicing a silicon single crystal ingot. As a method for growing a silicon single crystal ingot, there is CZ (Czochralski) method, FZ (Floating Zone) method, or the like, FZ method is better than CZ method in that it is possible to obtain a single crystal of high purity.

FIG. 3 is an explanatory view of growing a silicon single crystal ingot according to FZ method. First, a polycrystalline silicon raw material rod 1 of which a tip end is conically processed is held vertically. On a vicinity of a lower end thereof, there is almost coaxially disposed a tip end of a seed crystal 2, for example, having a square rod (or a cylindrical rod), 5 mm on a side (or a diameter), consisting of a silicon single crystal. A lower end of the polycrystalline silicon raw material rod 1 is heated to melt by a radio-frequency induction heating coil 3. The seed crystal 2 is fused to the melted part of the lower end of the polycrystalline silicon raw material rod 1, and then furthermore, an upper end of the seed crystal 2 is gradually melted. After reaching thermal balance, the single crystal growth starts with the seed crystal 2. In this case, an orientation of the growing crystal is the same as an orientation of the seed crystal 2.

Here, by thermal shock caused when the seed crystal 2 is fused to the silicon-melted part being at a high temperature on the lower end of the polycrystalline silicon raw material rod 1, slip dislocations are introduced at high-density in a part for growing a crystal following a seed crystal 2. Because the introduced slip dislocations cause polycrystallization of a crystal to be grown, for making the slip dislocations disappear, there is performed a so-called necking that a neck portion 4 is formed by narrowing down the single crystal-growing part so that a diameter thereof becomes, for example, 2-3 mm. By the necking, the dislocations are led outward to the direction of the single crystal growth and made to disappear at the neck portion 4. The crystal-growing part is made to be dislocation-free, for example, by leading the dislocations outward sufficiently by forming the neck portion 4 with a length of 20 mm or more, and thereafter increasing of a diameter thereof is initiated.

Next, from the initiation of the increasing of a diameter of the crystal-growing part to reaching a desired diameter, a single crystal is grown at an inverted conical form and thereby a cone part 5 is formed. After reaching the desired diameter, the single crystal is grown with controlling a crystal growth rate or a temperature so as to become constant in the desired diameter, and thereby so-called a straight body is formed. Sequentially, a silicon single crystal ingot 6 is grown along with forming a floating zone 7 by moving the heating coil 3 upward in the axial direction relatively to the polycrystalline silicon raw material rod 1. When the floating zone 7 reaches an end of the effective length of the polycrystalline silicon raw material rod 1, the silicon single crystal ingot 6 is disconnected. The silicon single crystal ingot 6 grown as described above is made to be dislocation-free by the necking as described above. The necking is widely known as Dash Necking method.

FIG. 4 is an X-ray observation view showing an aspect of dislocation-free growth by Dash Necking method. This is an X-ray observation view of a crystal cross-section of the seed crystal 2' to the conical part 5' when dislocation-free growth is performed by Dash Necking method in the growth of the silicon single crystal ingot whose crystal axis is a crystal orientation <111> by FZ method. Parts appearing in the form of a black line in the neck portion 4' are slip dislocations. According to the observation view expanding the neck portion 4', there can be observed an aspect that slip dislocations propagate outward to the axis for crystal growth and disappear.

Conventionally, a silicon single crystal ingot grown according to CZ method or FZ method as described above has mainly had an crystal orientation <100> or <111>. This is because silicon wafers having an orientation <100> or <111> have been mainly used for fabrication of semiconductor devices because of advantage in physical property or processes of growing a crystal or producing semiconductor devices.

FIG. 2 is a flow chart showing an example of a process for producing a silicon wafer according to a conventional FZ method. First, for example, there is prepared a seed crystal having its crystal axis with the just angle of a crystal orientation <111>. By using the seed crystal, there is grown a silicon single crystal ingot having its crystal axis with the just angle of a crystal orientation <111> by FZ method according to the above-described method. When the ingot is grown, dislocation-free growth is performed by Dash Necking method. Next, the grown ingot is cut to be cylindrical blocks and ground cylindrically and thereafter subjected to Orientation Flat process or Orientation Notch process. The obtained ingot is sliced in the direction perpendicular to the crystal axis of the ingot by using a slicing means such as an inner diameter slicer, a wire saw, or the like. Thereafter, a chamfering process, a lapping process, an etching process, and a polishing process are sequentially performed, and there is produced a silicon wafer having a desired crystal orientation <111>.

A silicon wafer having a crystal orientation <100> or <111> has been mainly used for fabricating semiconductor devices as described above. However, it has been noticed in the recent years that, because carrier mobility of a semiconductor device is greatly dependent on a crystal orientation of the wafer, the carrier mobility can be larger by using a silicon wafer having a crystal orientation <110> with respect to requests for speeding up of an working speed of a semiconductor device. For example, speeding up of a working speed of a semiconductor such as a switching rate can be expected. Therefore, the demand of the wafer is increasing.

However, it is known that there is a problem for growing a silicon single crystal ingot having its crystal axis with a crystal orientation of just <110> by CZ method or FZ method. Propagation of slip dislocations introduced in the crystal-growing part by thermal shock is determined by the crystal system thereof. However, because a crystal lattice structure of the silicon single crystal is a diamond structure, a plane of slipping of dislocations (a dislocation plane) is {111}, which is a plane of closest packing of atoms, and the slipping direction, namely the propagating direction of dislocations, is an orientation <110>, which is the direction of the shortest lattice vector.

In a silicon single crystal ingot having its crystal axis with an crystal orientation <100> or <111>, the dislocation plane has a degree of 54.74° or 70.53° respectively with respect to the crystal plane which is a sliced surface when the ingot is sliced in the direction perpendicular to the crystal axis. In the case that a dislocation plane and the crystal plane has such an angle, even if a crystal orientation is made to be the same as the direction of the single crystal growth when the single crystal is grown, the generated dislocations in the seed crystal can be led outward in the direction of the single crystal growth and made to disappear sufficiently by Dash Necking method as described above. However, when it is attempted to grow a single crystal having its crystal axis with a crystal orientation of just <110>, the direction of the single crystal growth corresponds with the direction of the propagation of slip dislocations. Therefore, even if Dash Necking method is performed, dislocations are not sufficiently led outward in the neck portion and thereby not made to disappear sufficiently and remain in the grown ingot and cause polycrystallization. Even if Dash Necking method is applied when a silicon single crystal ingot having its crystal axis with a crystal orientation <110> is grown as described above, it has been extremely difficult to obtain a dislocation-free silicon single crystal ingot successfully.

Therefore, in Japanese Patent Laid-open (Kokai) Publication No. 9-165298, Lawrence D. DYER "Dislocation-Free Czochralski Growth Of <110> Silicon Crystals", Journal of Crystal Growth vol. 47 (1979) pp. 533-540, and M. R. L. N. Murthy and J. J Aubert "Growth Of Dislocation-Free Silicon Crystal In The <110> Direction For Use As Neutron Monochromators", Journal of Crystal Growth vol. 52 (1981) pp. 391-395, and such, there was disclosed a technology of growing a dislocation-free silicon single crystal wafer having a crystal orientation <110> by using CZ method. For example, in the above references of L. D. DYER and M. R. L. N. Murthy, there is disclosed a method that by forming only plural sets each having a neck portion and a diameter-increasing part for during the necking when a silicon single crystal is grown according to CZ method, there is produced a dislocation-free silicon single crystal having a crystal orientation <110>. Moreover, in the Japanese Patent Laid-open (Kokai) Publication No. 9-165298, there is disclosed a method that by narrowing down the diameter to be slim, less than 2.0 mm, with applying magnetic field during the necking, dislocations are made to disappear when a silicon single crystal is grown by CZ method.

With regard to CZ method, it has been conventionally attempted to grow a silicon single crystal having its crystal axis with a crystal orientation <110> according to such a method as described above. On the other hand, with regard to FZ method, an effective method has not been established yet. Therefore, in the case that it is attempted to obtain a silicon wafer having a crystal orientation <110> by FZ method, it is difficult to grow a dislocation-free silicon single crystal having a crystal orientation <110> by a conventionally method, and if a crystal is grown, polycrystallization is frequently caused and success probability of dislocation-free growth is low, and therefore the crystal has been remarkably low in both sides of yield and productivity.

DISCLOSURE OF THE INVENTION

An object of the present invention is to solve the above problems and to provide a method for producing a silicon wafer having a crystal orientation <110> from a silicon single crystal ingot made to be dislocation-free at a high success rate by using Dash Necking method by FZ method, and a silicon wafer having an crystal orientation <110>.

In order to accomplish the above object, according to the present invention, there is provided a method for producing a silicon wafer having a crystal orientation <110> from a silicon single crystal ingot grown by FZ method, wherein, at least, an FZ silicon single crystal ingot is grown by being made to be dislocation-free by Dash Necking method using a seed crystal having its crystal axis inclined at a specified angle from a crystal orientation <110>, and the grown FZ silicon single crystal ingot is sliced at the just angle of a crystal orientation <110> to produce a silicon wafer having a crystal orientation <110>.

If a seed crystal having its crystal axis inclined at a specified angle from a crystal orientation <110> is used as described above, the direction of the single crystal growth is also inclined at a specified angle from a crystal orientation <110>. Therefore, the propagation direction of slip dislocations introduced at high density by thermal shock when the seed crystal is fused can be different from the direction of the single crystal growth. Accordingly, the dislocations can be led outward to the direction of the single crystal growth and made to disappear in the neck portion by Dash Necking, and there can be grown a FZ silicon single crystal ingot made to be dislocation-free with ease at a high success rate. And, if the grown FZ silicon single crystal ingot is sliced at the just angle of a crystal orientation <110> so as to correspond to the specified angle, there can be easily produced a silicon wafer having a crystal orientation <110>. Accordingly, it is possible to improve drastically yield and productivity of silicon wafers having a crystal orientation <110> suitable for fabricating high-speed semiconductor devices.

In this case, it is preferable that the sliced silicon wafer having a crystal orientation <110> is made to be a perfect circle by processing of chamfering.

With respect to the silicon wafer sliced at the just angle of a crystal orientation <110> from the silicon single crystal ingot having its crystal axis inclined at a specified angle from a crystal orientation <110>, the sliced surface thereof is also inclined with respect to the plane orthogonal to its crystal axis and therefore becomes a slightly elliptical shape. And the silicon wafer becoming an elliptical shape as described above is made to be a perfect circle by peripheral grinding and such in chamfering process, thereby the silicon wafer can be handled in the following processes as is conventionally done.

Moreover, it is preferable that the specified angle of inclining the seed crystal is 1° to 30°.

If the specified angle of inclining the seed crystal is 1° to 30° as described above, effect of disappearing of slip dislocations by Dash Necking method can be enhanced sufficiently, and when the sliced silicon wafer is made to be a perfect circle by peripheral grinding, an amount of the grinding can be reduced. Therefore, loss of the silicon single crystal material can be reduced.

Moreover, the present invention provides the silicon wafer having a crystal orientation <110> produced by the method of producing a silicon wafer according to any one of the methods for producing a silicon wafer.

The silicon wafer having a crystal orientation <110> produced as described above has a crystal orientation <110> and is made to be dislocation-free with ease at a high success rate by Dash Necking method and is that yield is good and productivity is high. Accordingly, it becomes a silicon wafer that is cheap, with high quality, and suitable for fabricating high-speed semiconductor devices.

If a seed crystal having its crystal axis inclined at a specified angle from a crystal orientation <110> is used according to the present invention, the direction of the single crystal growth is also inclined at a specified angle from a crystal orientation <110>, the propagation direction of slip dislocations introduced at high density by thermal shock when the seed crystal is fused can be different from the direction of the single crystal growth. Accordingly, the dislocations can be led outward to the direction of the single crystal growth and made to disappear by Dash Necking method, and there can be grown a FZ silicon single crystal ingot made to be dislocation-free with ease at a high success rate. And if the grown FZ silicon single crystal ingot is sliced at the just angle of a crystal orientation <110> so as to correspond to the specified angle, there can be easily produced a silicon wafer having a crystal orientation <110>. Accordingly, it is possible to improve drastically yield and productivity of silicon wafers having a crystal orientation <110> suitable for fabricating high-speed semiconductor devices.

BEST MODE FOR CARRYING OUT THE INVENTION

Hereinafter, embodiments of the present invention will be explained. However, the present invention is not limited to this.

As described above, when a silicon single crystal ingot having its crystal axis with a crystal orientation <110> is produced, it has been extremely difficult to obtain a dislocation-free silicon single crystal ingot even if Dash Necking method is adopted. With regard to CZ method, it has been attempted to grow a silicon single crystal having its crystal axis with a crystal orientation <110> according to a conventional method as described above. However, in FZ method, during the single crystal growth, the overall weight of both a polycrystalline silicon raw material rod and a silicon single crystal ingot, which is generally 60 kg or more, should be supported by a slim seed crystal having about 5 mm on a side and a neck portion having an about 2-3 mm diameter following this. If the neck portion is made to be slim, less than 2 mm, or plural sets each having a diameter-increasing part and a neck portion during the necking are formed as a conventional method in CZ method, there is caused problems that the weight balance is broken, strength of the neck portion becomes short, or the like. Therefore, it is impossible to apply such a method as performed in CZ method. Accordingly, in FZ method, an effective method has not been established yet. It is thought that a silicon single crystal ingot once grown by FZ method is used as a material and thereby the growth process by FZ method is performed again and a silicon single crystal ingot is made to be dislocation-free. However, the success probability of the dislocation-free growth is small and sufficient yield could not obtained. Therefore, in the case of attempting to obtain a silicon wafer having a crystal orientation <110> by FZ method, it is difficult to grow a dislocation-free silicon single crystal having its crystal axis with an crystal orientation <110> by a conventional method. If a crystal is grown, the success probability of the dislocation-free growth is low. Therefore, the crystal has been remarkably low in both sides of yield and productivity.

With respect to this, the present inventors found that if a FZ silicon single crystal is grown by using a seed crystal having its crystal axis inclined at a specified angle from a crystal orientation <110>, the propagation direction of slip dislocations can be different from the direction of the single crystal growth. Accordingly, the dislocations can be led outward to the direction of the single crystal growth and made to disappear in the neck portion by Dash Necking method, and therefore there can be grown a FZ silicon single crystal ingot made to be dislocation-free with ease at a high success rate. And the present invention was accomplished.

Hereinafter, an example of the present invention will be explained in detail with reference to drawings.

Figure 1:
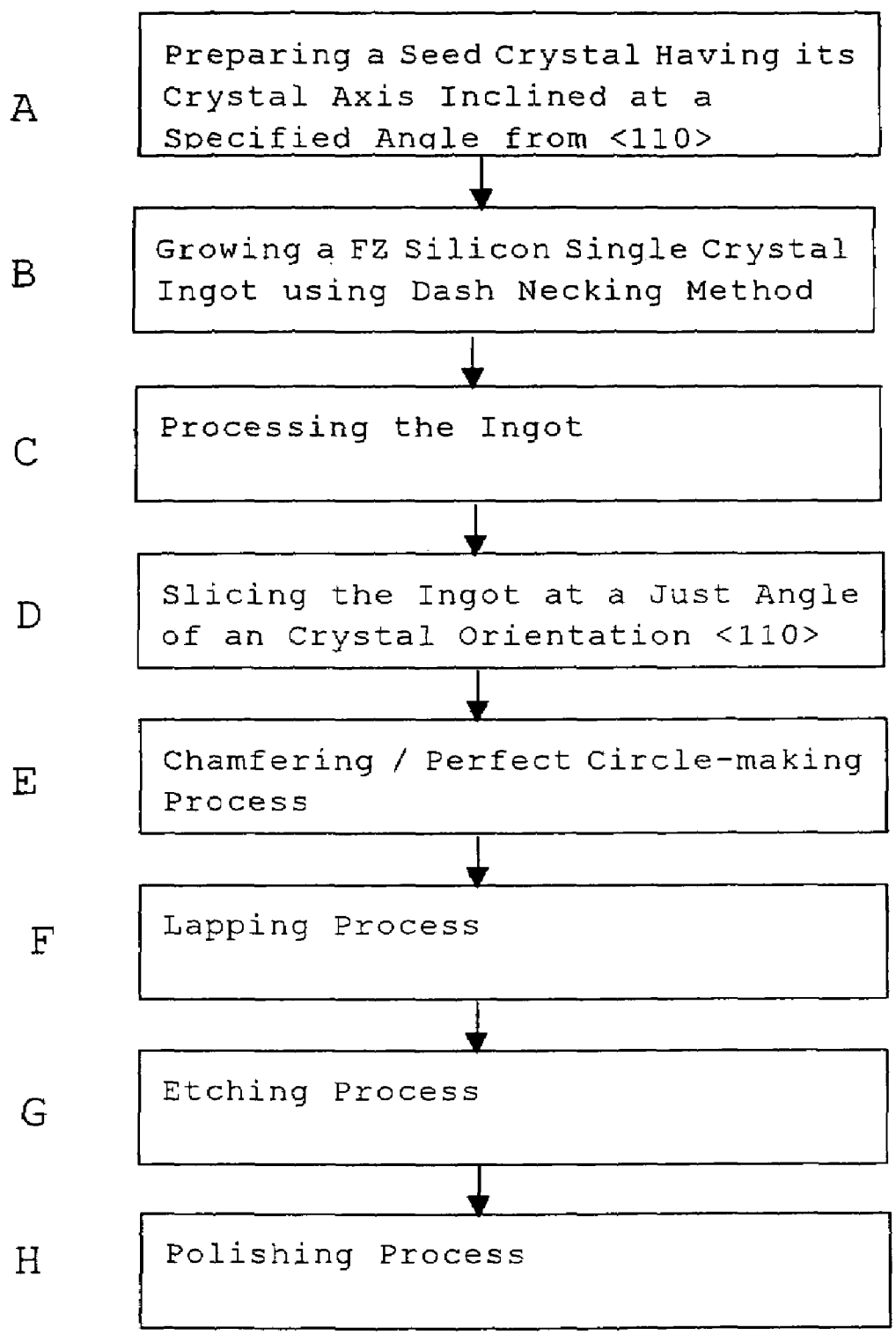
FIG. 1 is a flow chart showing an example of a production process of a silicon wafer having a crystal orientation <110> according to the present invention.
Figure 2:
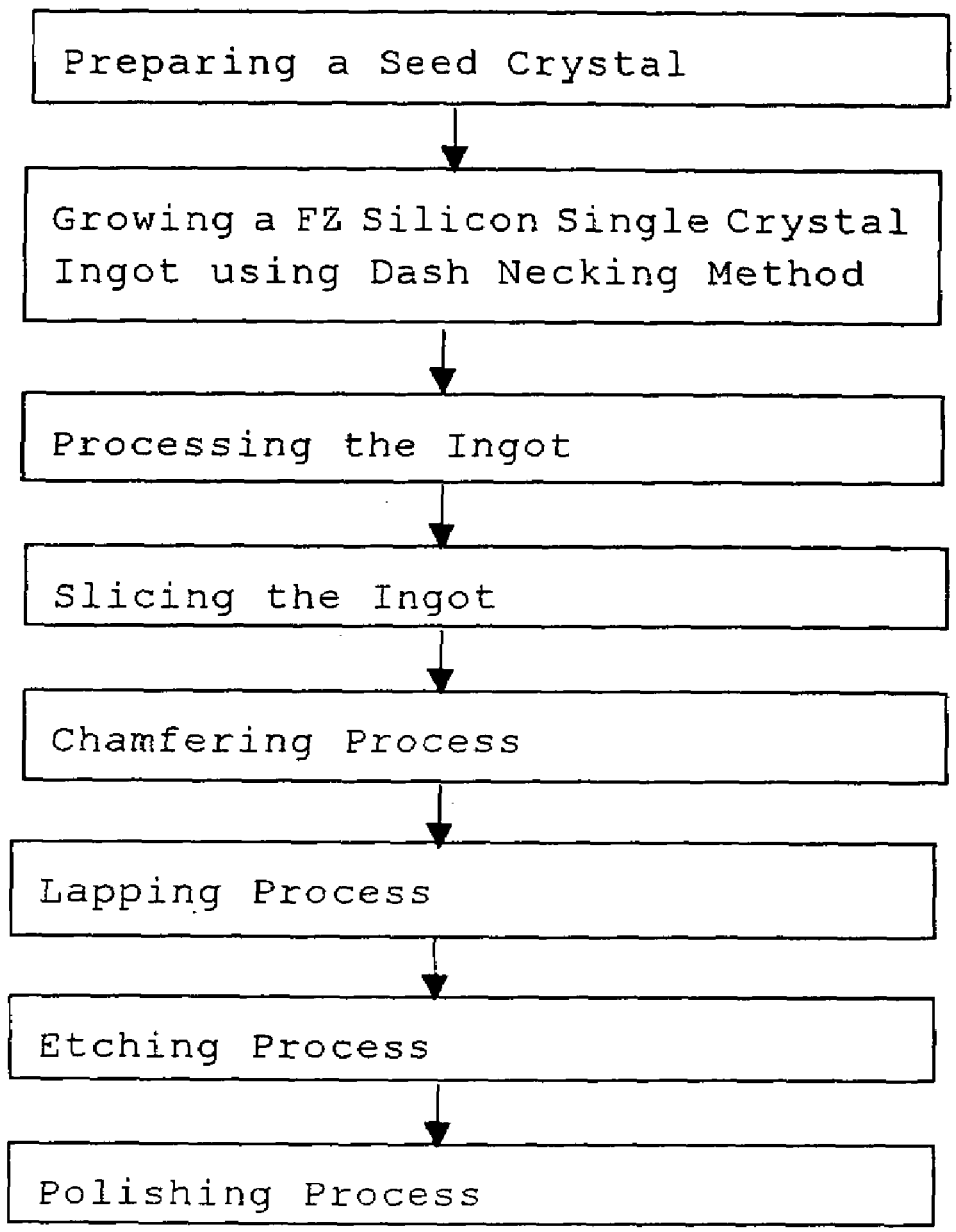
FIG. 2 is a flow chart showing an example of a production process of a silicon wafer by a conventional FZ method.
Figure 3:
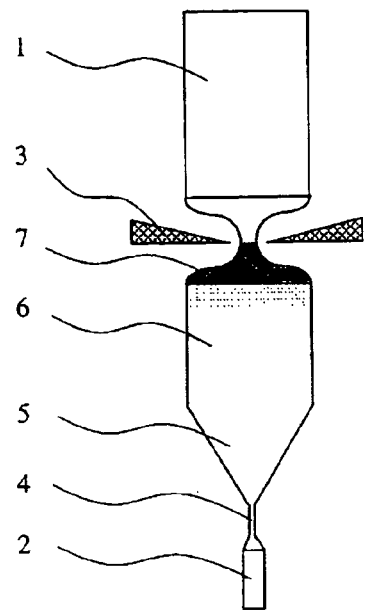
FIG. 3 is an explanatory view of growing a silicon single crystal ingot by a conventional FZ method.
Figure 4:
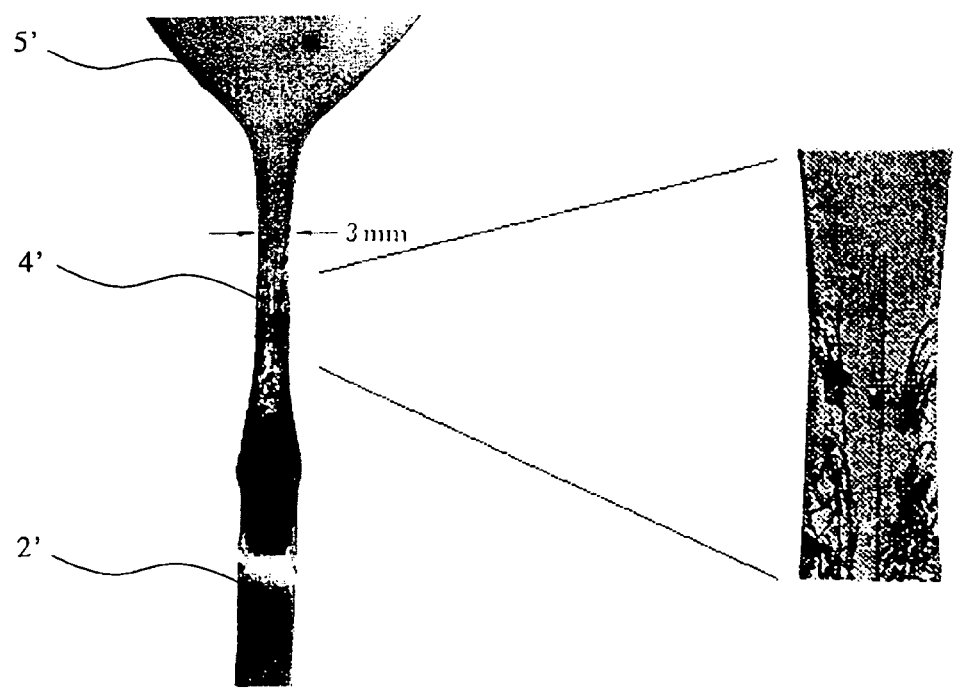
FIG. 4 is an X-ray observation view showing aspect of dislocation-free growth by Dash Necking method.

FIG. 1 is a flow chart showing an example of a production process of a silicon wafer having a crystal orientation <110> according to the present invention.

First, there is prepared a seed crystal consisting of a silicon single crystal having its crystal axis inclined from a crystal orientation <110> as FIG. 1A. In this case, if the inclined angle is too small, the effect of disappearing of dislocations by Dash Necking method becomes small. And if the inclined angle is too large, when the sliced silicon wafer is made to be a perfect circle by peripheral grinding in the following process, an amount of the grinding becomes large and loss of the silicon single crystal material becomes large. Therefore, it is preferable that the angle is 1° to 30°. A seed crystal is typically a square rod having 5 mm on a side. However it may be a cylinder having a diameter of about 5 mm.

Next, a silicon single crystal ingot is grown by FZ method by using the seed crystal as FIG. 1B. The growth by FZ method is performed as described above. In this time, thermal shock is caused when a seed crystal is fused to a high-temperature silicon-melted part on a lower end of the polycrystalline silicon raw material rod, slip dislocations are introduced at high-density in a part for growing a crystal following the seed crystal. The propagation direction of slip dislocations introduced at this time is a crystal orientation <110>. However, because the crystal axis of the seed crystal is inclined at a specified angle from a crystal orientation <110>, the direction of the single crystal growth of the single crystal-growing part following with the seed crystal is also inclined at a specified angle from a crystal orientation <110>. That is, the propagation direction of slip dislocations is inclined at a specified angle from the direction of the single crystal growth. Accordingly, if a neck portion is formed by narrow down a diameter of the single crystal-growing part into 2-3 mm and Dash Necking is performed, dislocations can be directed outward to the direction of the single crystal growth and made to disappear in the neck portion. Thereby, it becomes possible to perform dislocation-free growth at a high probability. For example, if a neck portion with a length of 10 mm or more is formed, dislocations can be sufficiently led outward and made to disappear. Therefore the crystal-growing part is made to be dislocation-free sufficiently. A diameter or a length of the neck portion may be appropriately set according to a condition of crystal growth, the inclined angle, or the like.

After performing the sufficiently dislocation-free growth as described above, diameter increase of the crystal-growing part is initiated and a cone part is formed. After reaching a desired diameter, a straight body is formed with controlling a growth rate or a temperature so as to become constant in the diameter. Sequentially, a silicon single crystal ingot is grown along with forming a floating zone. When the floating zone reaches an end of the effective length of the polycrystalline silicon raw material rod, the silicon single crystal ingot is disconnected. The silicon single crystal ingot grown as described above is made to be dislocation-free by Dash Necking method as described above and has its crystal axis inclined at a specified angle from a crystal orientation <110>.

Next, the grown silicon single crystal ingot is cut to be cylindrical blocks and ground cylindrically and thereafter subjected to Orientation Flat process or Orientation Notch process as FIG. 1C. These processes can be performed by following a standard by a conventionally known method.

Next, the processed silicon single crystal ingot is sliced as FIG. 1D. In this case, the crystal axis of the silicon single crystal ingot is inclined at a specified angle from a crystal orientation <110>. However, there can be obtained a silicon wafer having a crystal orientation <110> by slicing the silicon single crystal ingot at the just angle of a crystal orientation <110>. For slicing it at the just angle of a crystal orientation <110>, the silicon single crystal ingot is inclined at a specified angle and placed so that a crystal orientation <110> is the vertical direction. By using a slicing means such as an inner diameter slicer, a wire saw, or the like, the silicon single crystal ingot placed so as to be inclined may be cut in the horizontal direction, or the silicon single crystal ingot may be placed without being inclined and the silicon single crystal ingot may be sliced in an oblique direction of a specified angle by using the slicing means described above so as to be at the just angle of a crystal orientation <110>. Furthermore, the silicon single crystal ingot may be inclined and sliced in an oblique direction of a specified angle. In any method of them, the slicing can be easily performed by a tilting mechanism provided in a conventional slicing apparatus.

The silicon wafer having a crystal orientation <110> produced by being sliced at the just angle of a crystal orientation <110> as described above is sliced obliquely to the crystal axis of the cylindrical silicon single crystal ingot even if the wafer is sliced by any one of the above described methods. Therefore, the outer shape of the wafer is elliptical. Because it is difficult to handle the wafer in the following processes if the outer shape keeps elliptical, the wafer is made to be a perfect circle by peripheral grinding and such in chamfering process and thereby to be easy to handle (FIG. 1E). However, if the inclination of the crystal axis of the seed crystal from a crystal orientation <110> is large, the ellipticity of the silicon wafer having a crystal orientation <110> obtained by being sliced becomes large as much. In this case, an amount of grinding by peripheral grinding becomes large when the wafer is made to be a perfect circle, the silicon crystal material is lost as much. Accordingly, it is desirable that an angle of the inclination is 1-30°.

Thereafter, a lapping process (FIG. 1F) for improving flatness and plane parallelism of the sliced surface of the wafer, an etching process (FIG. 1G) for removing a mechanically damaged layer introduced on the surface by each of the above processes, a polishing process (FIG. 1H) for mirror-polishing the main surface of the wafer. All of these processes can be performed by conventionally known methods. There can be obtained a desired silicon wafer having a crystal orientation <110>. The silicon wafer having a crystal orientation <110> produced as described above is made to be dislocation-free with ease at a high success rate by Dash Necking method, and yield thereof is good and productivity thereof is high. Therefore, the silicon wafer is suitable for fabricating high-speed semiconductor devices that are cheap and with high quality.

Hereinafter, the present invention is concretely explained by Examples and Comparative Examples of the present invention. The present invention is not limited to these.

EXAMPLE

There was produced a square-rod seed crystal having 5 mm on a side, whose crystal axis was inclined at 15° from a crystal orientation <110> toward <111>. By using this, a silicon single crystal ingot with a diameter of 100 mm was produced by FZ method. A neck portion with a diameter of 3 mm and a length of 20 mm was formed during the growing, and dislocation-free growth by Dash Necking method was performed. 50 silicon single crystal ingots were grown in the same condition and a success rate of dislocation-free growth, a trouble rate, and a product-obtained yield were calculated as the number N of samples=50. The result is shown in Table 1. Here, a success rate of dislocation-free growth is a percentage of the number of times that generations of dislocations were not confirmed with the naked eye after Dash Necking. A trouble rate is a percentage of the number of ingots that dislocations appeared in the process of increasing a diameter of a crystal-growing part and to be polycrystallized, per the number of ingots that generations of dislocations were not confirmed with the naked eye after Dash Necking. Moreover, a product-obtained yield is a percentage of a part finally obtained as a single crystal product in the ingot succeeding in dislocation-free growth, per a weight of the raw material polycrystal.

COMPARATIVE EXAMPLE

By using a square-rod seed crystal having 5 mm on a side, whose crystal axis was the just angle of a crystal orientation <110>, a silicon single crystal ingot with a diameter of 100 mm was grown by FZ method. A neck portion with a diameter of 3 mm and a length of 20 mm was formed during the growing, and dislocation-free growth by Dash Necking method was performed. 51 silicon single crystal ingots were grown in the same conditions, and a success rate of dislocation-free growth, a trouble rate, and a product-obtained yield were calculated as the number N of samples=51. The result is shown in Table 1 with the result of Example.

TABLE 1

| Item | Example | Comparative Example |
|---|---|---|
| The Number N | 50 | 51 |
| Success Rate of Dislocation-Free Growth (%) | 74.0 | 13.7 |
| Trouble Rate (%) | 16.2 | 85.7 |
| Product-Obtained Yield (%) | 71.4 | 5.9 |

In Comparative Example, a success rate of dislocation-free growth was low, 13.7%, and furthermore, a trouble rate was 85.7%. That is, even in the ingots succeeding seemingly in dislocation-free growth with the naked eye by Dash Necking, a trouble rate becomes 80% or more by polycrystallization according to internally remaining dislocations. Therefore, it can be assumed that probability of dislocations made to disappear by Dash Necking is little in practice.

Moreover, because only such polycrystallized ingots could be obtained, a product-obtained yield was also low, 5.9%.

On the other hand, in Example, a success rate of dislocation-free growth was high, 74.0%, and a trouble rate was low, 16.2%. That is, it can be confirmed that internal dislocations were made to disappear sufficiently by Dash Necking, and a product-obtained yield was 71.4%, dramatically high compared to Comparative Example. That is, it was confirmed that a silicon wafer having a crystal orientation <110> produced according to the present invention was considerably improved in a success rate of dislocation-free growth by Dash Necking and a product-obtained yield, and the effect of the present invention was confirmed.

In addition, the present invention is not limited to the embodiments described above. The above-described embodiments are merely examples, and those having the substantially same constitution as that described in the appended claims and providing the similar working effects are included in the scope of the present invention.

The invention claimed is:

1. A method for producing a silicon wafer having a crystal orientation <110> from a silicon single crystal ingot grown by Floating Zone method (FZ method), wherein, at least, an FZ silicon single crystal ingot is grown by being made to be dislocation-free by Dash Necking method using a seed crystal having its crystal axis inclined at a specified angle from a crystal orientation <110>, and the grown FZ silicon single crystal ingot is sliced at the just angle of a crystal orientation <110> to produce a silicon wafer having a crystal orientation <110>, and the sliced silicon wafer having a crystal orientation <110> is made to be a perfect circle by processing of chamfering.

2. The method for producing a silicon wafer according to claim 1, wherein the specified angle of inclining the seed crystal is 1° to 30°.

* * * * *